(12) United States Patent
Nayak et al.

(10) Patent No.: US 7,429,526 B1
(45) Date of Patent: Sep. 30, 2008

(54) METHOD OF FORMING SILICIDE GATE WITH INTERLAYER

(75) Inventors: Deepak Kumar Nayak, Fremont, CA (US); Yuhao Luo, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 29 days.

(21) Appl. No.: 11/484,193

(22) Filed: Jul. 11, 2006

(51) Int. Cl.
*H01L 21/3205* (2006.01)

(52) U.S. Cl. .............................. 438/592; 257/E21.203

(58) Field of Classification Search ............... 257/213, 257/288, 412, 413, E21.19, E21.191, E21.195, 257/E21.203; 438/584, 585, 587, 588, 592
See application file for complete search history.

(56) References Cited

U.S. PATENT DOCUMENTS

| | | | |
|---|---|---|---|
| 6,441,464 B1 * | 8/2002 | Holmes et al. | 257/616 |
| 6,544,829 B1 | 4/2003 | Gopinath et al. | |
| 6,602,781 B1 | 8/2003 | Xiang et al. | |
| 6,905,922 B2 | 6/2005 | Lin et al. | |
| 2006/0125022 A1 * | 6/2006 | Kawamura | 257/384 |
| 2006/0205133 A1 * | 9/2006 | Trivedi et al. | 438/199 |

OTHER PUBLICATIONS

R. A. Donaton et al.; "Co silicide formation on SiGeC/Si and SiGe/Si layers"; Appl. Phys. Lett. 70 (10); Mar. 10, 1997; 1997 American Institute of Physics, pp. 1266-1268.

* cited by examiner

*Primary Examiner*—A. Sefer
*Assistant Examiner*—Kevin Quinto
(74) *Attorney, Agent, or Firm*—Scott Hewett

(57) ABSTRACT

A field-effect transistor ("FET") or similar device has a fully silicided ("FUSI") gate electrode. The gate electrode has a gate interface silicide portion between the gate dielectric and a bulk gate silicide portion. The gate interface silicide is formed by depositing a gate electrode interface layer having silicide retardation species underneath the metal/silicon layers used to form the gate silicide. The gate electrode interface layer retards silicide formation at the gate dielectric/gate electrode interface when the bulk gate silicide is formed, and the gate interface silicide is then formed at a higher temperature or longer heat cycle time.

11 Claims, 5 Drawing Sheets

METHOD OF FORMING SILICIDE GATE WITH INTERLAYER

FIELD OF THE INVENTION

The present invention relates generally to semiconductor devices, and more particularly to gate structures of field-effect transistors.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

ICs use various sorts of devices to create logic circuits. Many types of ICs use complementary metal-oxide-semiconductor ("CMOS") logic circuits. CMOS logic circuits use CMOS cells that have a first-conductivity-type metal-oxide-semiconductor ("MOS") field-effect transistor ("FET") (e.g. a P-type MOS ("PMOS") FET) paired with a second-conductivity-type MOS transistor (e.g. an N-type MOS ("NMOS") FET). CMOS cells can hold a logic state while drawing only very small amounts of current.

It is generally desirable that MOS transistors, whether used in a CMOS cell or used individually, provide good coupling between the gate electrode and the channel when operating voltage is applied to the gate of the MOS transistor. A conductive, uniform gate electrode promotes FET operation.

Amorphous silicon, poly-silicon, metal, and silicides have all been used as gate electrode materials. Silicide gates are desirable because they provide high conductivity and allow subsequent high-temperature processing. Typically, poly-silicon or amorphous silicon is deposed onto the wafer and nickel, cobalt, titanium, or other suitable metal is deposited over the silicon using well-known deposition and patterning techniques. The wafer is heated so that the metal layer combines with the silicon to form a silicide gate electrode. A fully silicided gate electrode is commonly referred to as a "FUSI" gate.

However, the silicon layer that is used to form the silicide gate electrode is relatively thick, and sometimes the composition of the gate electrode material at the interface with the gate dielectric layer is not uniform. If full silicidation is not achieved at the gate dielectric-gate electrode interface, the threshold voltage of the device may be adversely affected.

If silicidation, which occurs from the metal-silicon interface toward the gate electrode-gate dielectric interface, is not complete, the gate electrode-gate dielectric interface can be rough, and the silicide, whether completely or partially reacted, can penetrate into the gate dielectric, which also affects FET performance because it provides areas under the gate electrode that are closer to the channel than other areas, resulting in inconsistent threshold voltage and higher leakage current. Ultimately it may even damage the gate oxide and cause a functional failure of the device.

It is desirable to provide a FET device having an improved gate electrode structure and improved operation.

SUMMARY OF THE INVENTION

A field-effect transistor ("FET") or similar device has a fully silicided ("FUSI") gate. The gate has a gate interface silicide portion between the gate dielectric and a bulk gate silicide portion. The gate interface silicide is formed by depositing a gate electrode interface layer having silicide retardation species underneath the metal/silicon layers used to form the silicide. The gate electrode interface layer retards silicide formation at the gate dielectric/gate electrode interface when the bulk gate silicide is formed, and the gate interface silicide is then formed at a higher temperature or longer heat cycle time.

DETAILED DESCRIPTION OF THE DRAWINGS

Figure 1:
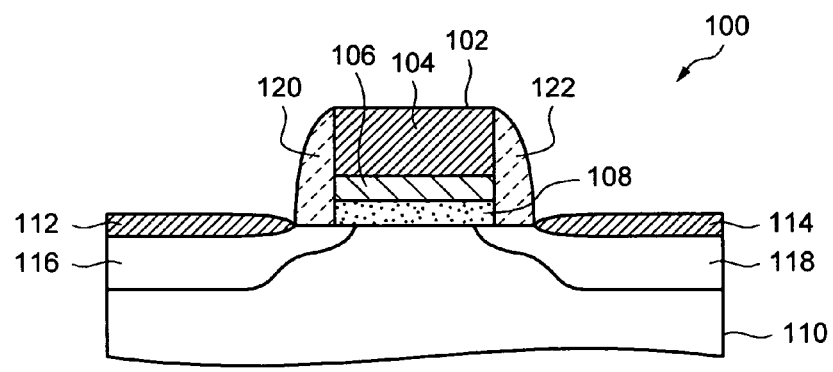
FIG. 1 is a simplified cross section of a FET according to an embodiment of the invention.

FIG. 1 is a simplified cross section of an FET 100 according to an embodiment of the invention. The FET 100 has a silicided gate electrode 102 with a first silicide region 104 and a second silicide region 106. The first silicide region 104 is made by combining polysilicon or amorphous silicon (see, e.g., FIG. 2F, ref. num. 220) with a silicide-forming metal, such as cobalt, nickel, or titanium. The second silicide region 106 includes species, such as germanium, carbon or boron, from a gate electrode interlayer (see, e.g., FIG. 2D, ref. num. 200). The gate electrode interlayer is a layer that forms silicide at a slower rate or higher temperature, or a layer that provides species that slows the rate of silicide formation or forms silicide at a higher temperature from the polysilicon or amorphous silicon. In other words, the gate electrode interlayer contains silicon in some embodiments, and does not contain silicon in other embodiments. For purposes of convenient discussion, such species will be referred to as "silicide retardation species."

The FET 100 also includes a gate dielectric 108 between the gate electrode and a semiconductor substrate 110, such as a silicon wafer, source and drain contacts 112, 114, which in a particular embodiment are silicide contacts, providing electrical contact to source and drain regions 116, 118. Gate sidewall spacers 120, 122 provide a well-known technique for forming lightly-doped drain ("LDD") regions, as is common in the art of FET fabrication. Subsequent processing forms well-known features, such as vias and inter-layer dielectric, which are omitted for simplicity of illustration. The dual-silicide gate electrode 102 provides a smooth, uniform interface with the gate dielectric 108, which provides a uniform threshold voltage, as well as other parameters, and also blocks the penetration of silicide into gate dielectric and improves the reliability of the device.

Figure 2A:
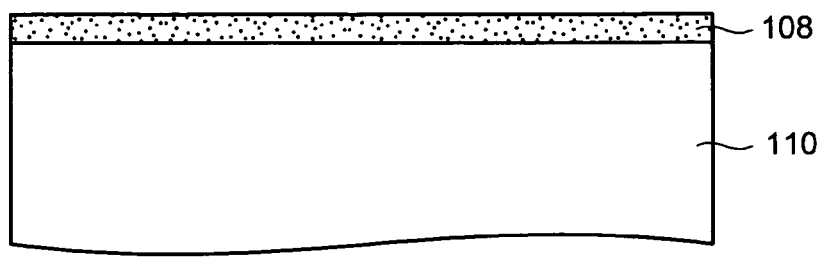
FIGS. 2A-2J are cross sectional views illustrating steps of forming an FET according to an embodiment of the invention.

FIGS. 2A-2J are cross sectional views illustrating steps of forming an FET according to an embodiment of the invention. FIG. 2A shows a semiconductor substrate 110, such as a silicon wafer, with a gate dielectric layer 108. The gate dielectric layer 108 is a thermal silicon oxide layer, modified thermal silicon oxide layer (e.g. nitrogenated silicon oxide), or deposited layer of dielectric material, such as hafnium oxide, or other dielectric layer, of which several examples are known in the art of FET technology.

Figure 2B:
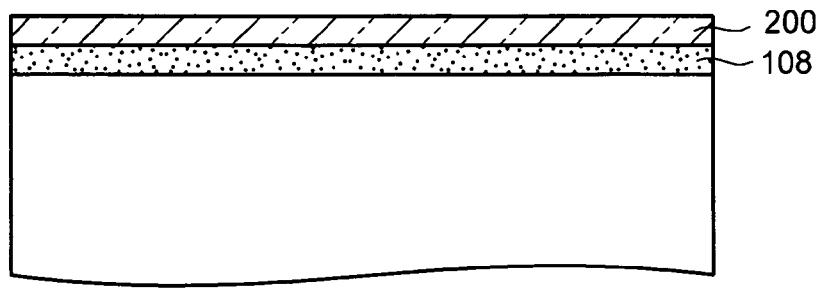

FIG. 2B shows a gate electrode interlayer 200 formed over the gate dielectric layer 108. The gate electrode interlayer 200 includes silicide retardation species, such as Ge or C. Silicide retardation species retard the formation of silicide from silicon and metal, relative to the formation of silicide absent the silicide retardation species. For example, a silicide retardation specie increases the temperature at which silicide forms, relative to the temperature of formation from silicon and metal.

The gate electrode interlayer 200 is formed by chemical vapor deposition ("CVD"), plasma-enhanced CVD ("PECVD"), molecular beam epitaxy ("MBE") or other suitable technique. The gate electrode interlayer slows the formation of silicide at the gate dielectric interface during a gate silicidation sequence to provide a more uniform and smoother gate electrode interface with the gate dielectric. In a particular embodiment, the gate silicidation sequence includes one or more thermal processing steps (e.g. rapid thermal pulses ("RTPs")) to form bulk gate silicide, and then a thermal processing step, typically at a higher temperature but alternatively for a longer time, to form silicide at the gate dielectric interface to provide a fully silicided gate electrode. The silicide at the gate dielectric interface includes silicide retardation species from the gate electrode interface layer. In a particular embodiment, the gate electrode interface layer 200 includes SiGe or SiGeC and is about 20 nm thick to about 30 nm thick. Alternatively, the gate electrode interface layer does not include silicon, but does include elemental species that retard the formation of silicide relative to the formation of the bulk silicide, i.e., the silicide formed from poly-silicon or amorphous silicon and an overlying metal layer, such as a Co, Ni, or Ti layer.

Figure 2C:
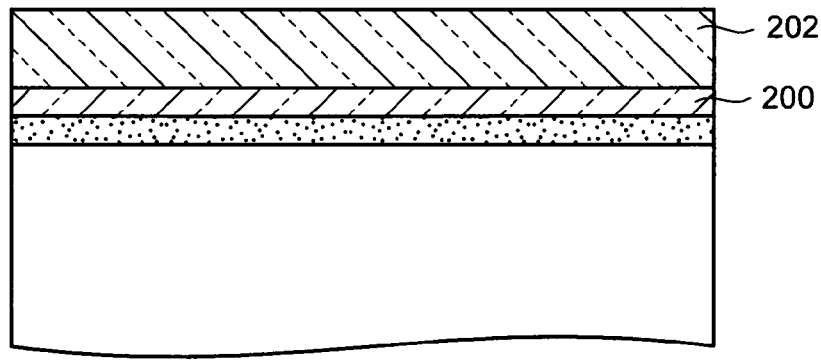

FIG. 2C shows a silicon layer 202 deposited on the gate electrode interlayer 200. The silicon layer 202 is typically a layer of poly-silicon or amorphous silicon about 10 nm to about 200 nm thick; however, dimensions of layers or other features are merely exemplary. Such a layer is commonly referred to as a "poly layer," which will be used herein for purposes of convenient discussion. The poly layer is often doped by elements, such as boron or phosphorus, to tune the work function of the gate electrode.

Figure 2D:
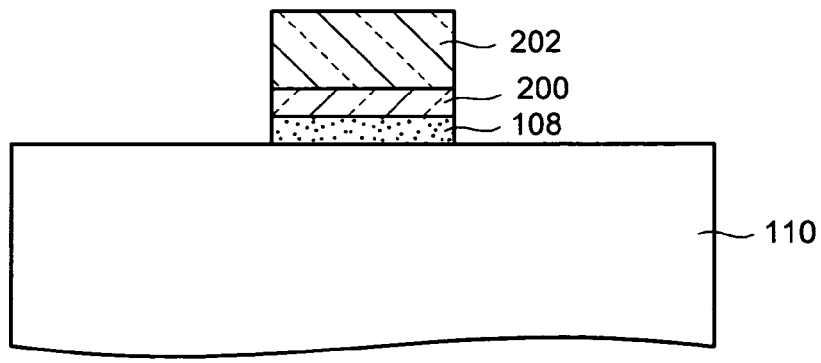

FIG. 2D shows the poly layer 202, gate electrode interlayer 200, and gate dielectric layer 108 on the semiconductor substrate 110 after what is commonly referred to as gate etch. Generally, a photomask is used to define the gate electrode regions and an anisotropic plasma etch is used to remove unwanted portions of the layers. Gate etch techniques are commonly known in the art of semiconductor fabrication, and a more detailed description is therefore omitted.

Figure 2E:
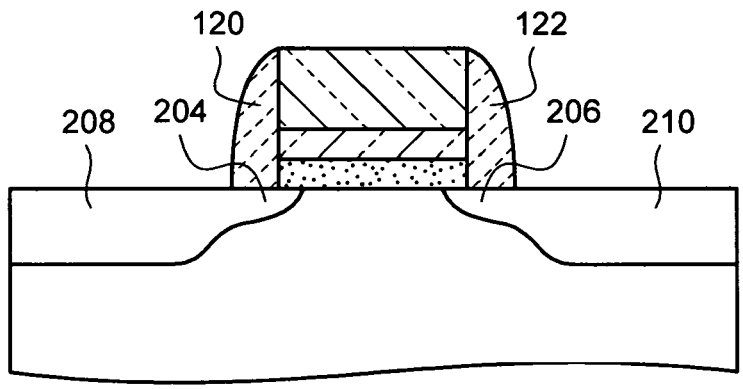

FIG. 2E shows the FET after processing steps familiar to those of skill in the art. "Lightly-doped drain" ("LDD") regions 204, 206 were formed with a low-dose, low energy implant self-aligned to the gate structure. Then, sidewall spacers 120, 122 were formed on the gate structure, and source and drain regions 208, 210 were formed, typically by a higher dose, higher energy implant. Many different techniques for forming source and drain regions are known and suitable for embodiments of the invention. Similarly, many different sidewall techniques are known that are suitable for embodiments. The cross sections are merely illustrative of one of many possible embodiments.

Figure 2F:
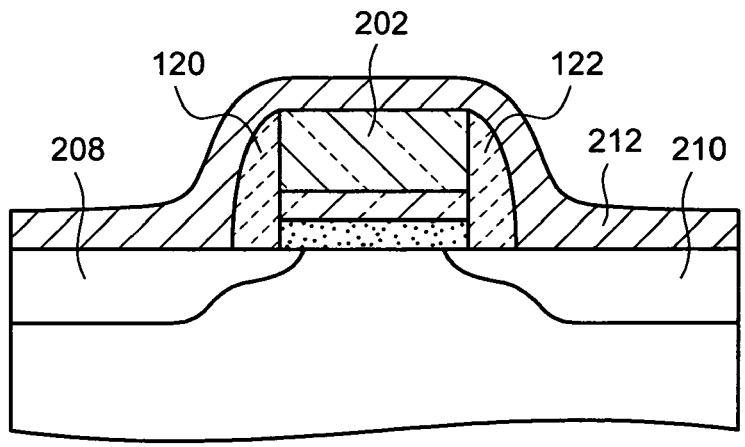

FIG. 2F shows a metal layer 212 deposited over the poly layer 202, sidewall spacers 120, 122, and source/drain regions 208, 210. The metal layer 212 is a silicide-forming metal, such as cobalt, nickel, or titanium. Many other silicide-forming metals are known and are used in alternative embodiments.

Figure 2G:
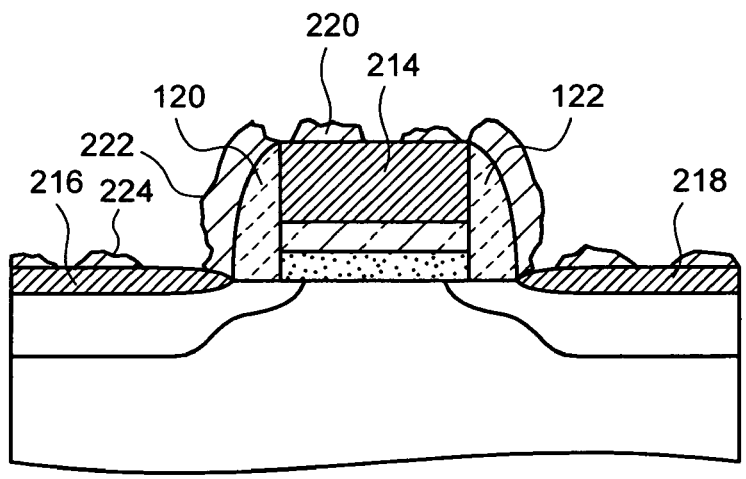

FIG. 2G shows a first gate silicide portion ("bulk gate silicide") 214 formed from the gate silicon (see FIG. 2D, ref. num. 202) and the metal layer (see FIG. 2F, ref. num. 212). Source and drain silicide contacts 216, 218 have also been formed concurrently with the bulk gate silicide; however, source and drain contacts are formed separately from the gate silicide, and may be formed from a different metal layer, in alternative embodiments.

The bulk gate silicide 214 is typically formed using one or more thermal treatments, such as one or more rapid thermal pulses. Remnant (i.e. unreacted) metal 220, 222, 224 remains on the bulk gate silicide 214, sidewall spacer 120 and source/drain contact 216. Remnant metal 222 remains on the sidewall spacer 120 because the metal does not form silicide with the sidewall spacer material. In alternative embodiments, the thickness of the metal layer (see FIG. 2F, ref. num. 212) is matched to the thickness of the gate silicon layer (see FIG. 2C, ref. num. 202) so that the metal overlying the gate silicon is completely consumed during formation of the bulk gate silicide 214.

In some embodiments, the bulk gate silicide is metal rich, having the general composition $M_X Si$, where M is a silicide-forming metal species and X is greater than 1. In other embodiments, the bulk gate silicide is essentially MSi. In some embodiments, such as in CMOS devices, the composition of the bulk gate silicide is selectively adjusted to provide a first composition over a first half (e.g. N-type FET) of a CMOS cell, and to provide a second composition over a second half (e.g. P-type FET) of the CMOS cell, such as by selectively thinning the gate silicon layer thickness or metal layer thickness over one half of the CMOS cell. In some embodiments, a series of thermal treatments are used to form the bulk gate silicide. For example, a first RTP is used to combine the metal and silicon into silicide, and then a second RTP is used to control the phase or composition of the silicide.

Figure 2H:
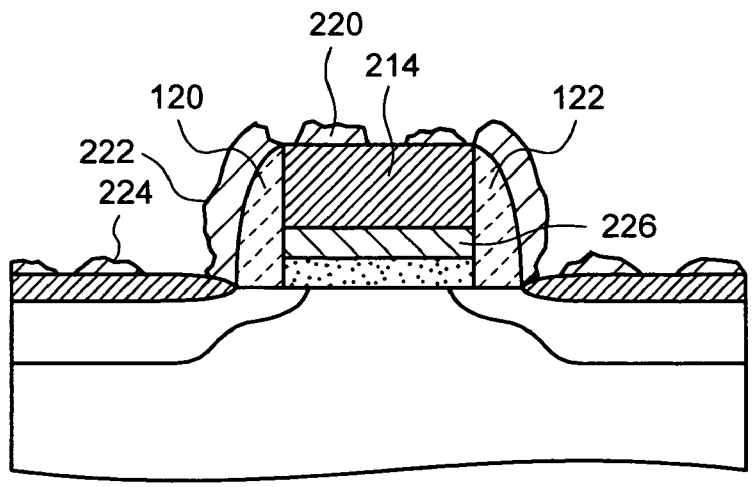

FIG. 2H shows a gate interface silicide 226 having silicide retardation species from the gate electrode interlayer (see FIG. 2D, ref. num. 200). The gate interface silicide 226 is formed after having formed the bulk gate silicide 214. In other words, the bulk gate silicide 214 is formed during a first thermal process, and the gate interface silicide 226 is formed during a subsequent thermal process. In some embodiments, the thermal process used to form the gate interface silicide 226 also controls or modifies the phase of the bulk gate silicide 214. The silicide retardation species in the gate electrode interlayer (see FIG. 2D, ref. num. 200) retards formation of the gate interface silicide during the thermal process used to form the bulk gate silicide, and hence, the gate interface silicide includes silicide retardation species from the gate electrode interlayer. Depending on the thermal history of the finished IC, the bulk gate silicide 214 might also include incidental silicide retardation species that out-diffuse from the gate electrode interlayer before the gate interface silicide 226 is formed, or from the gate interface silicide 226 after it has been formed.

The relatively slower forming gate interface silicide provides a more uniform silicide structure at the silicide/gate dielectric interface, as well as better process controllability and uniformity. The gate interface silicide is smoother, providing a more spatially consistent Vth, and in particular embodiments also provides a uniform silicide phase that provides a consistent electronic work function across the gate area.

In a particular embodiment, cobalt is used in the metal layer (see FIG. 2F, ref. num. 212) and SiGeC is used in the gate interface layer (see FIG. 2D, ref. num. 200). Bulk gate CoSi forms at a temperature of about 500° C., and converts to $CoSi_2$ at a temperature of about 600° C. The disilicide phase provides a lower sheet resistance (about 4-5 Ohms-per-square) than the monosilicide phase (about 50-80 Ohms-per-square). Thus, the disilicide phase is desirable in some embodiments to provide low gate resistance and rapid FET operation. In conventional cobalt-based FUSI gates, the cobalt and silicon are combined using a first RTP, and then the cobalt silicide is converted to the disilicide phase using a second, higher temperature, RTP. However, an SiGeC gate electrode interlayer retards the formation of $CoSi_2$ so that $CoSi_2$ forms between the bulk gate silicide and the gate dielectric at a temperature of about 800° C. to about 850° C. The gate electrode interface layer delays disilicide formation at the gate-gate oxide interface, providing a more electrically and physically uniform interface, and superior FET operation with reduced gate leakage current, improved reliability, higher operating speed, and more uniform FETs across the IC. Retardation of cobalt disilicide formation is discussed in further detail in *Co Silicide Formation on SiGeC/Si Layers*, by R. A. Donaton et al., APPL. PHYS. LETT. 70, 10 (Mar. 10, 1997), the disclosure of which is hereby incorporated by reference in its entirety for all purposes.

Figure 2I:
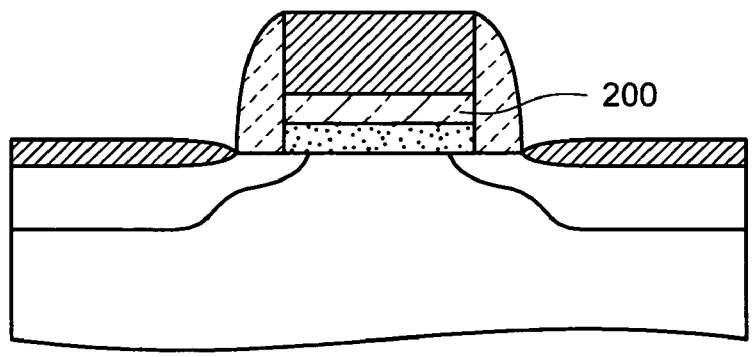
Figure 2J:
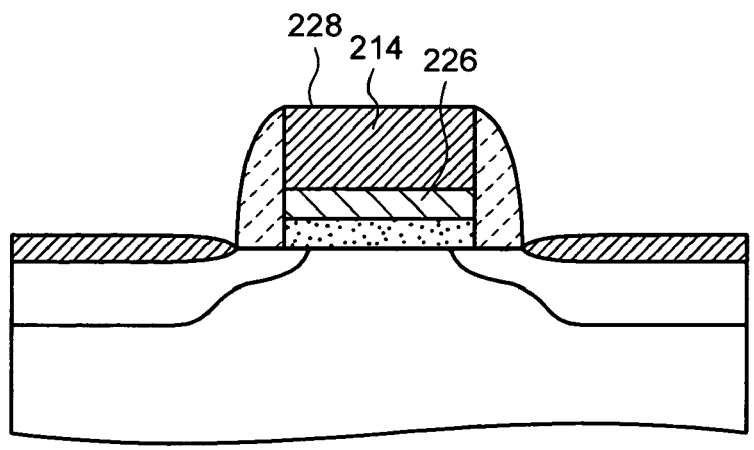

After silicidation of the gate electrode is complete, the metal remnants 220, 222, 224 are removed (etched off), resulting in the FET structure shown in FIG. 2J. The FET structure has a fully silicided gate 228 having the bulk gate silicide 214 and the gate interface silicide 226.

Alternatively, the metal remnants are removed prior to forming the gate interface silicide, as shown in FIG. 2I. After removing the excess metal, the device is thermally treated, such as with a high-temperature RTP, to convert the gate electrode interlayer 200 to gate interface silicide 226, as shown in FIG. 2J. Other processing sequences may become apparent to those of skill in the art of silicide-gate FET fabrication, such as a damascene FUSI gate process according to an embodiment. In an exemplary damascene process, the gate dielectric, the gate electrode interlayer, and the poly-Si gate are formed in a trench of dielectric material, such as $SiO_2$ or SiN. After CMP, a metal layer is deposited on top of the poly-Si gate, and silicidation is performed to form a FUSI gate. Dielectric around the gate is then removed. Or the dielectric material can be etched to form spacer around gate. In an alternative gate process, a temporary (sacrificial) gate material is etched away to form a gate recess (trench). A metal layer and then a silicon layer are deposited into the gate recess and reacted to form a silicided gate electrode, as is further described in U.S. Pat. No. 6,602,781 by Xiang et al. (Aug. 5, 2003), which is hereby incorporated by reference for all purposes.

Embodiments include a gate electrode interlayer incorporated into a damascene gate process or a temporary gate process. The gate electrode interlayer is deposited on the gate dielectric prior to the metal layer or silicon layer from which the bulk gate silicide is formed.

Figure 3:
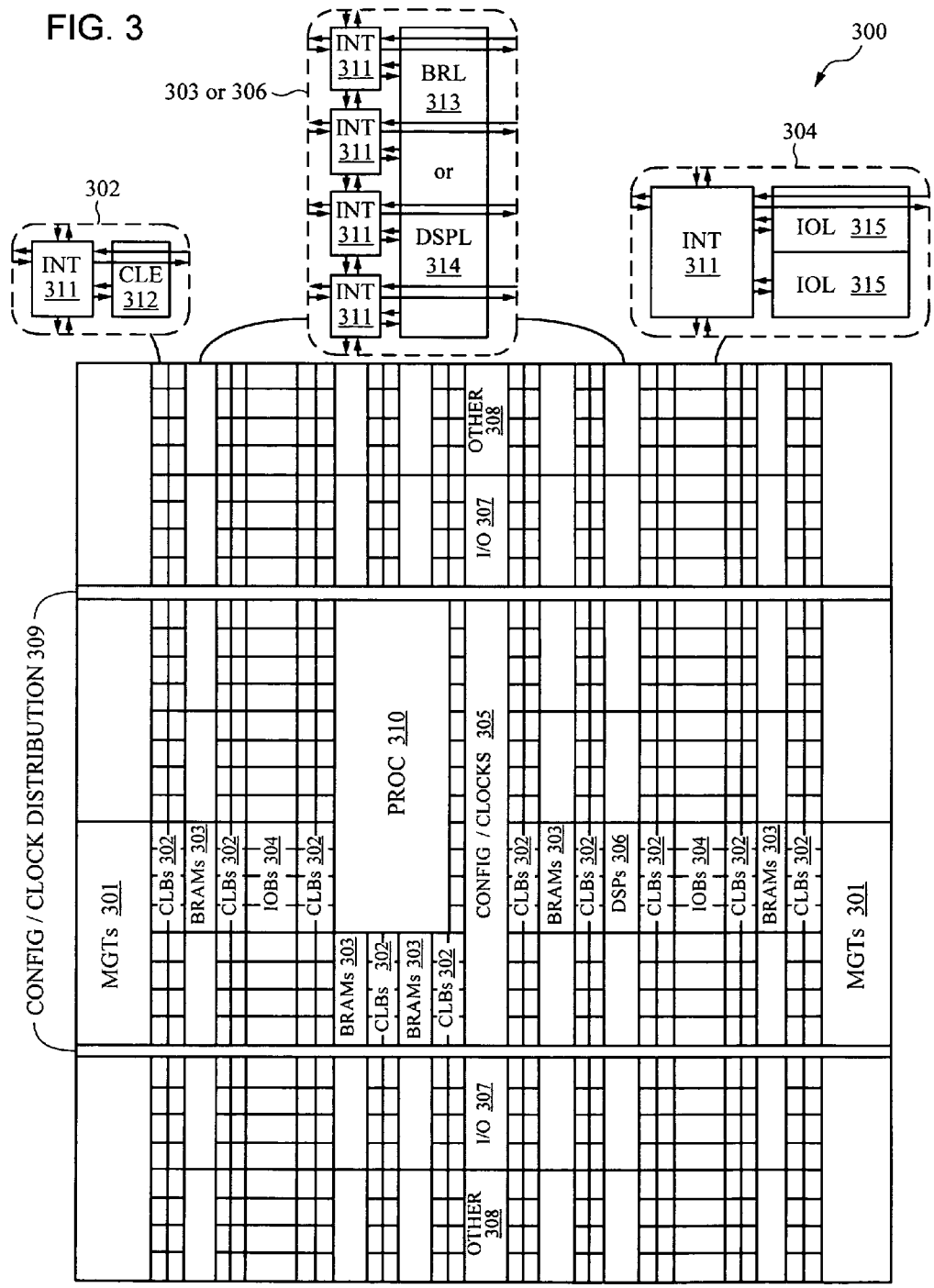
FIG. 3 is a diagram of an integrated circuit according to an embodiment of the invention.

FIG. 3 is a plan view of an integrated circuit 300 according to an embodiment of the invention. The integrated circuit is an FPGA that includes CMOS portions in several of the functional blocks, such as in RAM and logic, and is fabricated using a CMOS fabrication process. Silicon-based gate oxide layers according to one or more embodiments of the invention are incorporated in any of several functional blocks, such as a memory block, logic block, I/O block, clock circuit, transceiver, or other functional block; within many functional blocks; or within a physical section or segment of the FPGA 300. MOS devices with fully silicided gates according to embodiments of the invention are particularly desirable in FPGAs because they allow small, fast FETs with low gate series resistance and consistent threshold voltage. Providing a consistent (uniform) threshold voltage reduces leakage current, which is particularly important for advanced FPGAs. Also a gate electrode interlayer can block the damage caused by a FUSI gate electrode to the gate dielectric. This improves (reduces) gate leakage and reliability.

The FPGA architecture includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307) (e.g., configuration ports and clock ports), and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 3.

For example, a CLB 302 can include a configurable logic element (CLE 312) that can be programmed to implement user logic plus a single programmable interconnect element (INT 311). A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element (INT 311). As will be clear to those of skill in the art, the actual I/O pads connected, for example, to the I/O logic element 315 are manufactured using metal layered above the various illustrated logic blocks, and typically are not confined to the area of the input/output logic element 315. In the pictured embodiment, a columnar area near the center of the die (shown shaded in FIG. 3) is used for configuration, clock, and other control logic.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic.

Figure 4:
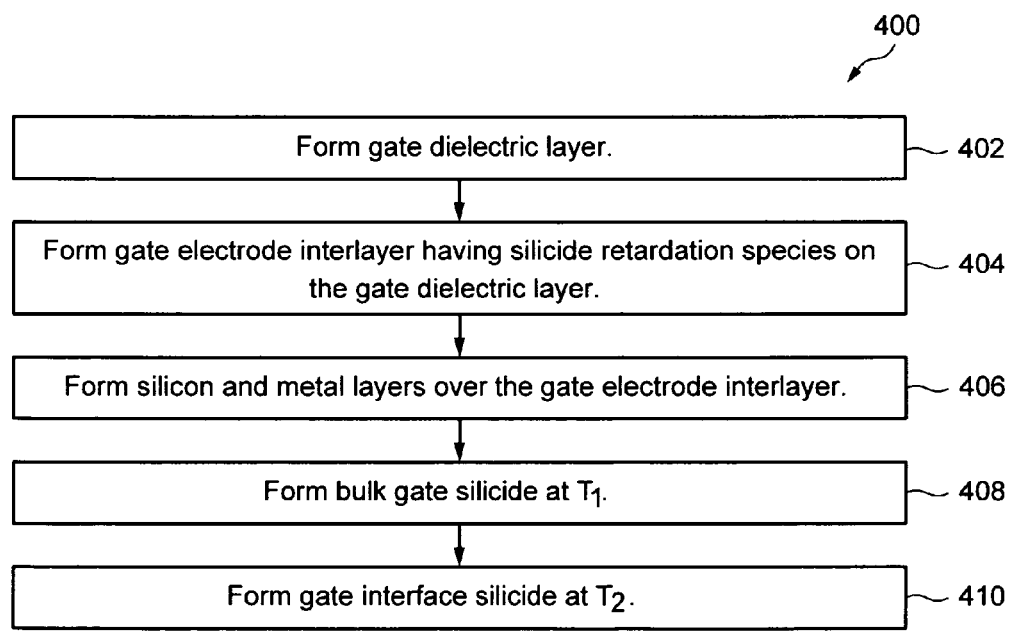
FIG. 4 is a flow chart of a method of fabricating an FET according to an embodiment of the invention.

FIG. 4 is a flow chart of a method 400 of fabricating an FET according to an embodiment of the invention. A gate dielectric layer if formed on a semiconductor substrate (step 402). A gate electrode interlayer having silicide retardation species is formed on the gate dielectric layer (step 404), and silicon and metal layers are formed over the gate electrode interlayer (step 406). In a particular embodiment, a poly-silicon or amorphous silicon layer is formed on the gate electrode interlayer, and a metal layer is formed on the silicon layer.

Bulk gate silicide is formed from the silicon and metal layers using a first thermal process (step 408). In a particular embodiment, the first thermal process is an RTP that raises the temperature of the device to a temperature less than the temperature for forming gate interface silicide. In a more particular embodiment, the first thermal process raises the temperature of the device to less than 650° C., which is the temperature often used to form bulk silicide in a conventional FUSI process. In an alternative embodiment, the first thermal process includes more than one RTP, or a timed thermal treatment that avoids forming gate interface silicide. Gate interface silicide is formed using a second thermal process (step 410) that achieves a higher temperature than the first thermal process. In a particular embodiment, a temperature greater than 800° C. is achieved during the second thermal treatment, which is sufficient to form a low-resistance silicide in the presence of the silicide retardation species of a SiGe or SiGeC gate electrode interlayer.

While the present invention has been described in connection with specific embodiments, variations of these embodiments will be obvious to those of ordinary skill in the art. For example, other retardation species may be used in the gate electrode interlayer, or other processing sequences may be followed. Embodiments also use different FUSI for NMOS and PMOS in a CMOS process. For example, the N-well or P-well mask is used to selectively modify the gate electrode interlayer in one half (i.e. the PMOS FET or NMOS FET) of a CMOS cell to selectively provide a different work function or interface property, for example, or different electrode interface layers are. Therefore, the spirit and scope of the appended claims should not be limited to the foregoing description.

The invention claimed is:

1. A method of fabricating a field-effect device comprising:
   forming a gate dielectric layer on a semiconductor substrate;
   forming a gate electrode interlayer having silicide retardation species on the gate dielectric layer;
   forming a silicon layer over the gate electrode interlayer;
   forming a metal layer over the silicon layer;
   forming bulk gate silicide from the silicon layer and metal layer at a first temperature; and
   forming gate interface silicide between the bulk gate silicide and the dielectric layer at a second temperature, the second temperature being greater than the first temperature.

2. The method of claim 1 wherein the first temperature is not greater than 650° C.

3. The method of claim 1 wherein the second temperature is not less than 800° C.

4. The method of claim 1 wherein forming bulk gate silicide comprises a plurality of rapid thermal pulses.

5. The method of claim 1 wherein the gate electrode interlayer comprises SiGe.

6. The method of claim 1 wherein the gate electrode interlayer comprises SiGeC.

7. The method of claim 1 further comprising, between forming bulk gate silicide and forming gate interface silicide: removing remnant metal from the device.

8. The method of claim 1 wherein forming gate interface silicide further includes converting the bulk gate silicide to a selected phase.

9. The method of claim 1 wherein the silicon layer is formed on the gate electrode interlayer and the metal layer is formed on the silicon layer.

10. The method of claim 1 wherein the metal layer is formed on the gate electrode interlayer and the silicon layer is formed on the metal layer.

11. The method of claim 1 wherein the silicon layer is a poly-silicon layer.

* * * * *